United States Patent
Ohsawa et al.

(10) Patent No.: US 6,514,847 B1
(45) Date of Patent: Feb. 4, 2003

(54) METHOD FOR MAKING A SEMICONDUCTOR DEVICE

(75) Inventors: Kenji Ohsawa, Kanagawa (JP); Tomoshi Ohde, Kanagawa (JP)

(73) Assignee: Sony Corporation, Tokyo (JP)

( * ) Notice: Subject to any disclaimer, the term of this patent is extended or adjusted under 35 U.S.C. 154(b) by 146 days.

(21) Appl. No.: 09/626,277

(22) Filed: Jul. 25, 2000

Related U.S. Application Data

(62) Division of application No. 09/199,305, filed on Nov. 25, 1998.

(30) Foreign Application Priority Data

Nov. 28, 1997 (JP) .......................................... P09-327938

(51) Int. Cl.⁷ ............................................... H01L 21/44
(52) U.S. Cl. ........................ 438/614; 438/125; 438/124; 438/126; 438/127
(58) Field of Search ................................. 438/110, 111, 438/112, 115, 121, 122, 123, 124, 125, 126, 127, 977, 612, 613, 614

(56) References Cited

U.S. PATENT DOCUMENTS

| | | | |
|---|---|---|---|
| 4,963,002 A | 10/1990 | Tagusa et al. | |
| 5,075,641 A | * 12/1991 | Weber et al. | 204/192.18 |
| 5,355,283 A | * 10/1994 | Marrs et al. | 257/687 |
| 5,518,964 A | * 5/1996 | DiStefano et al. | 438/126 |
| 5,581,122 A | 12/1996 | Chao et al. | |
| 5,708,567 A | 1/1998 | Shim et al. | |
| 5,821,608 A | 10/1998 | DiStefano et al. | |
| 5,841,191 A | 11/1998 | Chia et al. | |
| 5,859,475 A | 1/1999 | Freyman et al. | |
| 5,909,057 A | 6/1999 | McCormick et al. | |
| 5,909,058 A | 6/1999 | Yano et al. | |
| 5,994,773 A | * 11/1999 | Hirakawa | 257/668 |

FOREIGN PATENT DOCUMENTS

EP  0 731 506  9/1996

* cited by examiner

Primary Examiner—Kevin M. Picardat
(74) Attorney, Agent, or Firm—Sonnenschein, Nath & Rosenthal

(57) ABSTRACT

In a semiconductor device, a plurality of wiring films are formed on a front surface of a base comprising an insulating resin and having electrode-forming holes, the surfaces of the wiring films and the surface of the base being positioned on the same plane and at least parts of the wiring films overlapping with the electrode-forming holes; a conductive material is embedded into the electrode-forming holes to form external electrodes on the back surface, away from the wiring films, of the base; a semiconductor element is positioned on the front surface of the base with an insulating film therebetween, the back surface of the semiconductor element being bonded to said front surface of the base; wires bond the electrodes of the semiconductor element to the corresponding wiring films; and a resin seals the wiring films and the wires.

5 Claims, 7 Drawing Sheets

HIG. 5H

METHOD FOR MAKING A SEMICONDUCTOR DEVICE

CROSS-REFERENCE TO RELATED APPLICATIONS

This is a division of U.S. Ser. No. 09/199,305, filed Nov. 25, 1998.

BACKGROUND OF THE INVENTION

1. Field of the Invention

The present invention relates to a semiconductor device, a method for making the same, and to an electronic device utilizing the semiconductor device.

2. Description of the Related Art

In recent years, various wire-bond-type chip size packages (CSPs) have appeared in response to multi-electrode trends of semiconductor chips. Among the different types of CSPs, FIG. 7A shows a flexible printed circuit (FPC) type CPS. The FPC type CPS comprises a base a composed of a polyimide resin, and wiring films b composed of a metal such as copper formed on the surface of the base a. Holes c for forming electrodes (herein after referred to as "electrode-forming holes c") are formed in the base a, and fine spherical electrodes d composed of solder are formed in the electrode-forming holes c. A semiconductor chip f placed on the base a is bonded to the base a with a silver-paste film e. Gold bonding wires g connect electrodes of the semiconductor chip f with the corresponding wiring films b. The semiconductor chip f and the bonding wires g are sealed with a sealing resin h.

FIG. 7B shows a rigid substrate type CPS. The rigid substrate type CPS comprises a rigid wiring substrate i having holes (through-holes) j for forming electrodes (hereinafter referred to as electrode-forming holes), wiring films k formed on the rigid wiring substrate i, and wiring films l. The wiring films l are connected to the wiring films k, functions as an external electrode, and do not require solder spherical electrodes. A semiconductor chip f is placed on an insulating film m composed of a resist between the wiring films k, and is bonded to the insulating film m with a silver-paste film e. Gold bonding wires g connect electrodes of the semiconductor chip f with the corresponding wiring films k. The semiconductor chip f and the bonding wires g are sealed with a sealing resin h.

Although the FPC type CPS shown in FIG. 7A has an advantage of a high rate of heat dissipation, it does not allow electroplating since fine solder spherical electrodes are in the wiring films b which are electrically isolated from each other. Thus, it is significantly difficult to form fine solder spheres. Since it is impossible to reduce the diameter of the electrode-forming holes c, reduction in the array pitch between the hole-electrodes is limited. Accordingly, the appearance of the electrode-forming holes and of the spherical electrodes is inferior. Since the wiring films b are formed by selective etching, production of a fine pattern is limited. Furthermore, the base a is flexible; hence workability is inferior and production of large devices is difficult.

Although the rigid substrate type has an advantage that no solder spherical electrode is formed, it is difficult to reduce the diameter of the electrode-forming holes to 0.35 mm or less. This is a factor limiting higher integration of semiconductor devices. Furthermore, production of a fine wiring film pattern is difficult, the appearance of the electrode-forming holes is inferior, and heat dissipation is slow. Since the electrode-forming holes are formed by drilling, production is difficult.

SUMMARY OF THE INVENTION

It is an object of the present invention to provide a CSP- or BGA-type semiconductor device that allows mounting of fine spherical electrodes.

It is another object of the present invention to provide a CSP- or BGA-type semiconductor device that achieves miniaturization of electrode-forming holes, fineness of a wiring film pattern, improved appearance, and simplified production process.

A first aspect of the present invention is a semiconductor device comprising: a plurality of wiring films formed on a front surface of a base comprising an insulating resin and having electrode-forming holes, the surfaces of the wiring films and the surface of the base being positioned on the same plane and at least parts of the wiring films overlapping with the electrode-forming holes; a conductive material embedded into the electrode-forming holes to form external electrodes on the back surface, away from the wiring films, of the base; a semiconductor element positioned on the front surface of the base with an insulating film therebetween, the back surface of the semiconductor element being bonded to the front surface of the base; and wires for bonding the electrodes of the semiconductor element to the corresponding wiring films.

Since the wiring films are formed on a front surface section of the base so as to embed them; surface steps are not formed. Since a semiconductor device is mounted onto the surface, bonding of the semiconductor device and wire bonding are readily performed, resulting in enhancing reliability of the semiconductor device. Since the electrode-forming holes are formed by exposure and development of the base, fineness and high integration permitting large-scale integration and multi-electrodes of the semiconductor device can be achieved.

A metal ring may be bonded on the front surface of the base at the exterior of the connecting sections with wires in the wiring films. In such a preferred embodiment, the ring is used as an electrical power source, for example, a ground source, as an electrostatic shield for electrostatically shielding between the semiconductor device and the exterior, and as a dam for preventing leakage of the sealing resin to the exterior.

A second aspect of the present invention is A method for making a film circuit comprising: a step of forming wiring films on a metal film for stopping etching as an underlying layer by plating using a mask film, the mask being selectively formed on a front surface of a metal substrate; a step of forming a base comprising an insulating resin and having electrode-forming holes on the front surface of the metal substrate such that at least parts of the wiring films are partly exposed; and a step of etching at least the region of the metal substrate, in which the wiring films are formed, from the back surface until the metal film for stopping etching is exposed.

Since the electrode-forming holes can be formed by patterning of the insulating resin on the metal substrate, fineness of the electrode-forming holes can be achieved. Thus, the diameter of the electrode-forming holes can be reduced to 0.22 mm or less, whereas the lower limit of the diameter is 0.25 mm for a conventional FPC type, or 0.35 mm for a rigid substrate type. Such fineness of the electrode-forming holes can increase the array density of the electrode-forming holes. The electrode-forming holes can be formed by patterning the insulating resin with a reduced working load and increased productivity compared with the formation of electrode-forming holes by drilling as in the rigid substrate type.

Preferably, the metal film for stopping etching is deposited on the surface of the metal substrate; a mask film is selectively formed on the metal film for stopping etching, and the wiring films are formed on the metal film as an underlying layer through the mask film by plating; and after completing the etching step for exposing the metal film for stopping etching from the back surface at least in the region of the metal substrate in which the wiring films are formed, the metal film for stopping etching is removed.

The region, in which at least wiring films are formed, of the metal substrate is etched from the back surface so that the underlying metal film for etching stop is exposed and the metal substrate remains as a ring at the exterior. Thus, the remaining section can be used as a ring. The ring can be used as a ground electrical source terminal and an electrostatic shield, as described above. Since the ring forms an outer shape of the semiconductor device and is formed by etching, working accuracy can be increased. Thus, the semiconductor device has high shape accuracy.

Since it is produced using a metal substrate as a mother material, deformation such as distortion will not occur during the production. Thus, working is easy. A large semiconductor device, therefore, can be readily formed.

A third aspect of the present invention is an electronic device comprising a semiconductor device comprising: a plurality of wiring films formed on a front surface of a base comprising an insulating resin and having electrode-forming holes, the surfaces of the wiring films and the surface of the base being positioned on the same plane and at least parts of the wiring films overlapping with the electrode-forming holes; a conductive material embedded into the electrode-forming holes to form external electrodes on the back surface, away from the wiring films, of the base; a semiconductor element positioned on the a front surface of the base with an insulating film therebetween, the back surface of the semiconductor element being bonded to the front surface of the base; and wires for bonding the electrodes of the semiconductor element to the corresponding wiring films.

BRIEF DESCRIPTION OF THE DRAWINGS

FIGS. 5A to 5K are cross-sectional views of steps of a second embodiment of the method for making the semiconductor device in accordance with the present invention;

DESCRIPTION OF THE PREFERRED EMBODIMENT

Figure 1A:
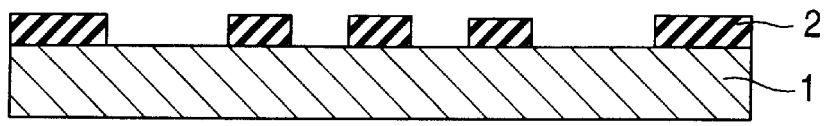
FIGS. 1A to 1I are cross-sectional views showing steps of a first embodiment of a method for making a semiconductor device of the present invention.

A semiconductor device of the present invention comprises a plurality of wiring films formed on a front surface of a base composed of an insulating resin and having electrode-forming holes, the surfaces of the wiring films and the surface of the base being positioned on the same plane and at least parts of the wiring films overlapping with the electrode-forming holes; a conductive material embedded into the electrode-forming holes to form external electrodes protruding from the back surface of the base; a semiconductor element positioned on the front surface of the base with an insulating film therebetween, the back surface of the semiconductor element being bonded to the front surface of the base; wires for bonding the electrodes of the semiconductor element to the corresponding wiring films.

The semiconductor device can be produced by a method for making a semiconductor device comprising: a step of forming wiring films on a metal film for stopping etching as an underlying layer by plating using a mask film, the mask being selectively formed on a front surface of a metal substrate; a step of forming a base composed of an insulating resin and having electrode-forming holes on the front surface of the metal substrate such that at least parts of the wiring films are partly exposed; and a step of etching at least the region of the metal substrate, in which the wiring films are formed, from the back surface until the metal film for stopping etching is exposed.

The metal substrate functions as a base material in the production of the semiconductor device including the formation of the wiring films and external electrodes by plating and as passage of a plating current, although it may later form an outer ring. It is preferable that the metal substrate comprise copper or a copper-based material having high conductivity. Since these materials have significantly high rigidity, they are not flexible even when thin, and thus have high workability. It is preferable that the thickness be approximately 150 $\mu$m when copper or a copper-based material is used.

A photosensitive separable acrylic resist can be used as a mask film during plating for forming the wiring films. In this case, the mask film is formed by patterning including exposure and development and then the wiring films are formed using the mask film. After the plating treatment, the mask film is peeled off. An epoxyacrylic photosensitive eternal resist film (having a thickness of, for example, 40 $\mu$m) may be used. Also, in this case, the mask film is formed by patterning including exposure and development and the wiring films are formed by plating using the mask film. After the plating treatment, however, the resist film is not removed, although the mask film is peeled off. Thus, the surface of the wiring film and the surface of the base are positioned completely on the same plane; in other words, the surface is planarized. Nickel electrodes will be formed without deformation in the subsequent step, since the underlying layer does not have a stepped structure. The material is not limited to the above-mentioned one. For example, materials that function as masks when a wiring film of metal such as copper is formed are usable.

As a base, for example, a laminate film of a polyamic acid-type polyimide film and a photosensitive layer provided thereon (thickness: for example, 25 $\mu$m) may be used. The laminate film is patterned by exposing and developing the photosensitive layer, and then etching the polyamic acid-type polyimide film with an etching solution such as an alkaline solution. The polyamic acid-type polyimide film is sufficiently cured by heat treatment at 280° C. for approximately 30 minutes. The thickness of the resist mask film is, for example, approximately 25 μm. The entire mask film may be formed of a photosensitive resin and be patterned by exposure to form electrode-forming holes. In the formation of the base, various modifications are possible.

It is preferable that the wiring film be formed by plating copper on a nickel underlayer. Although the wiring film is formed by plating on a metal substrate composed of, for example, copper, it is difficult to deposit by directly plating a dense copper wiring film on the copper. Furthermore, when the wiring film is exposed by etching the metal substrate, an etching stopper is necessary to protect the copper wiring film from being etched. Nickel is most suitable for the etching stopper. The thickness of the nickel film may be, for example, 2 μm. It is preferable that the thickness of the copper wiring film be, for example, 25 μm, although it depends on the specifications and performance demands of the semiconductor device.

After forming the base having electrode-forming holes, external electrodes are formed by plating, for example, nickel with a thickness of 40 to 150 μm thereon. Alternatively, they may be formed by plating nickel in a thickness of approximately 100 μm and then by plating solder in a thickness of approximately 100 μm, and by reflow-shaping the solder. Accordingly, various modifications are available for the formation of the external electrodes.

The metal substrate is etched from the back surface. Although the etching is essential for exposure of the wiring film, it may be performed on the entire surface or may be performed selectively. In selective etching, the etching is preferably performed in a region in which the wiring film is formed so that the metal substrate is left as a peripheral ring. The peripheral ring can be used as a reinforcing element, a ground electrode and an electrostatic shielding element of the electrical power source, and a dam for blocking the flow of the sealing resin (in the case of CSP). Thus, selective etching is preferred to complete etching. Etching can be performed using an alkaline etchant (ammonia type) that can etch copper but cannot etch nickel. Thus, nickel can function as an etching stopper.

It is preferable that the external electrode be formed of nickel and the surface of the nickel plating film be plated with gold, in view of satisfactory contact formation. Preferably, an underlayer is generally provided for gold plating. In this case, the external electrode and the metal film for stopping etching are formed of nickel; hence it is not necessary to form an additional nickel underlayer for satisfactory gold plating. Of course, the present invention is applicable to the above-mentioned embodiment in which the external electrode is formed of nickel and a solder plating film, and other embodiments.

The present invention is applicable to both CPS-type and BGA-type semiconductor devices.

The semiconductor device in accordance with the present invention can be used in various electronic devices, and in particular, compact electronic devices, such as portable phones, and contributes to miniaturization and improvement in reliability of the devices.

Preferred embodiments of the present invention will be described in detail with reference to the attached drawings. FIGS. 1A to 1I are cross-sectional views showing the steps of a method for making a CSP-type semiconductor device as a first embodiment of the present invention.

With reference to FIG. 1A, a metal substrate 1 composed of copper or a copper alloy with a thickness of 50 to 250 μm is prepared, and a resist film 2 or a mask film with a thickness of 30 to 60 μm is selectively formed. A typical resist is an acrylic photosensitive separable resist or an epoxyacrylic photosensitive inseparable resist. The resist is patterned by exposure and development to form a mask film 2.

Figure 1B:
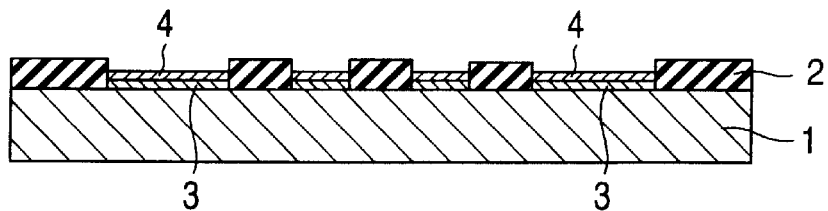

With reference to FIG. 1B, a copper wiring film 4 having a nickel underlayer 3 is formed on the surface of the metal substrate 1 using the resist film 2 as a mask. The thickness of the copper wiring film 4 is in a range of approximately 15 to 30 μm, and is preferably 25 μm. The thickness of the nickel underlayer 3 is in a range of approximately 1 to 5 μm, and is preferably 2.5 μm. The nickel underlayer 3 blocks etching of the copper wiring film 4 when the metal substrate 1 is etched from the back surface to expose wiring. Thus, the nickel underlayer 3 functions as a metal film for stopping etching. Alternatively, a metal substrate 1 with an entire nickel underlayer 3 provided thereon may be used and the entire nickel underlayer 3 may be etched to avoid short-circuiting between wiring films 4 after the etching to expose wiring. Although this configuration will be described in a second embodiment, it can also be applied to this embodiment.

Figure 1C:
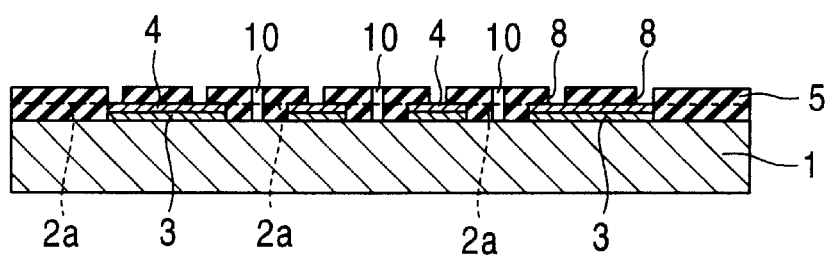

When the resist film 2 is of an acrylic photosensitive separable type, it is removed. In contrast, when the resist film 2 is of an epoxyacrylic photosensitive inseparable type, it is not removed. A base 5 (thickness: for example 25 μm) composed of, for example, a polyimide resin is formed and patterned to form electrode-forming holes 8 and smaller vent holes 10 at given positions. FIG. 1C shows a state after the patterning. Vent holes 10 release gas formed in the bottom of the base 5 in order to prevent separation of the base 5 due to thermal expansion during heat treatment.

The base 5 may be composed of, for example, a laminate film of a polyamic acid-based polyimide film and a photosensitive layer provided thereon. The base 5 is patterned by exposing and developing the photosensitive layer, and then etching the polyamic acid-type polyimide film with an etching solution such as an alkaline solution. The polyamic acid-type polyimide film is sufficiently cured by heat treatment at 280° C. for 30 minutes. The entire mask film may be formed of a photosensitive resin and may be patterned by exposure to form electrode-forming holes 8.

Figure 2A:
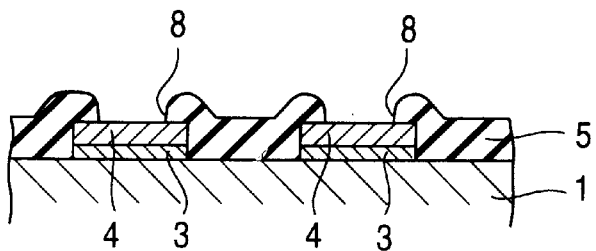
FIGS. 2A and 2B are enlarged cross-sectional views illustrating the states after forming the bases when a separable resist film and an inseparable resist film, respectively, are used as resist films in the first embodiment.
Figure 2B:
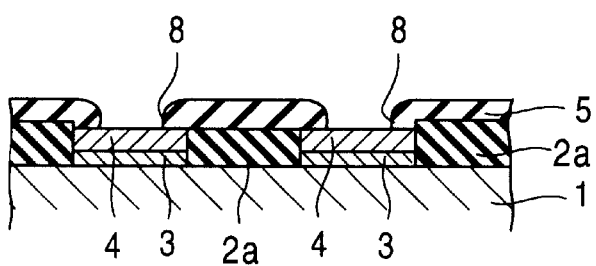

FIGS. 2A and 2B are enlarged cross-sectional views illustrating the states of the bases 5 when a separable resist film 2 and an inseparable resist film 2, respectively, are used. When the inseparable resist is used, the residual section 2a of the resist film 2 remains on the substrate 1. When the inseparable resist is used, the surface of the wiring film 4 and the surface of the base 5 can be arranged on substantially the same plane; that is, the surface is planarized. Nickel electrodes 6 will be formed without deformation in the subsequent step, since they are formed on the flat surface. In these two cases, the spaces between the adjacent wiring films 4 (the nickel films 3) are embedded by the base 5 so that the base 5 and the wiring films 5 form a flat surface.

Figure 1D:
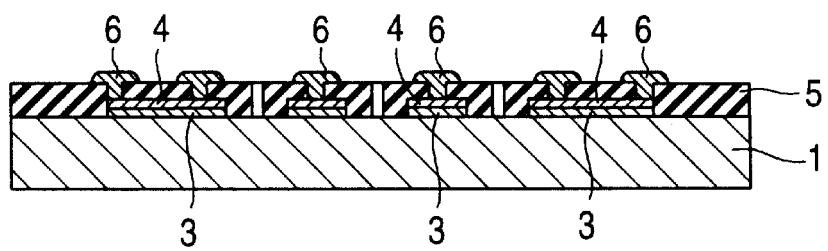

With reference to FIG. 1D, a nickel film 6 is deposited in the electrode-forming holes 8 by electroplating to form spherical electrodes. The thickness of the plating layer is approximately 40 to 150 μm.

Figure 1E:
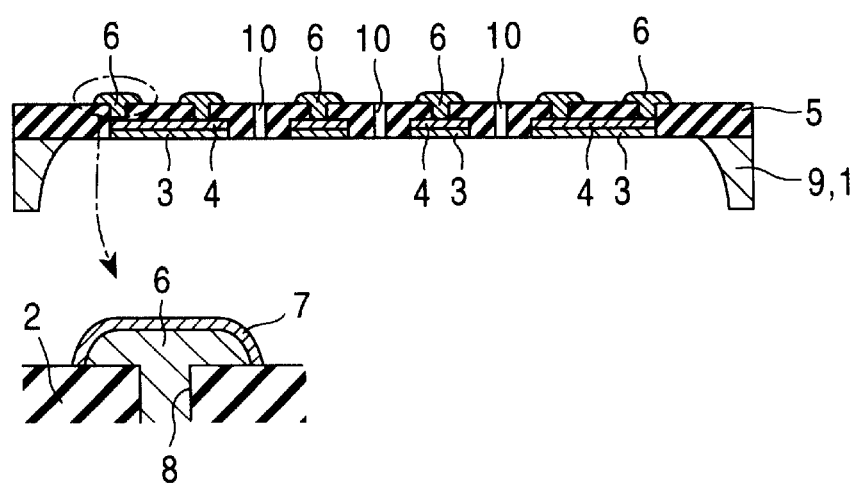

With reference to FIG. 1E, the metal substrate 1 is selectively etched from the back surface so that it remains as a peripheral ring 9 at the peripheral section of each semiconductor device while the wiring film 4 is exposed on the nickel underlayer 3. An ammonia-type alkaline etchant is used for etching. The nickel underlayer 3 blocks etching of the copper wiring film 4. A gold film 7 (thickness: for example, 0.3 to 6 μm) is formed by plating on the nickel films 3 and 6. The gold film 7 is depicted in the enlarged external electrode 6 that is shown in the bottom section of, although it is not depicted either in FIG. 1E or in the drawings after FIG. 1E, for the sake of convenience.

Figure 1F:
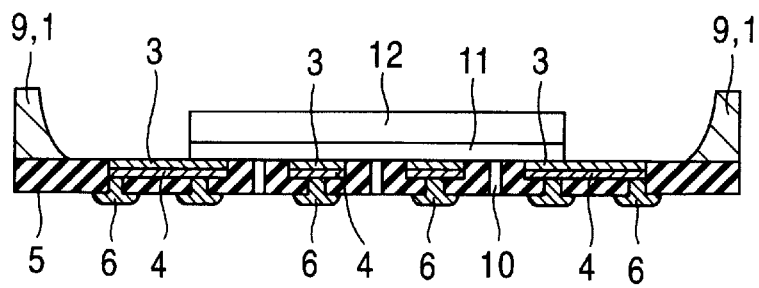

With reference to FIG. 1F, a heat dissipating plate 12 (thickness: for example, 100 μm) composed of copper or a 42 alloy is bonded to the front surface of the base 5 by a bonding agent 11 (thickness: for example, 50 μm). The heat dissipating plate 12 enhances heat dissipation from the semiconductor device that will be subsequently mounted.

Figure 1G:
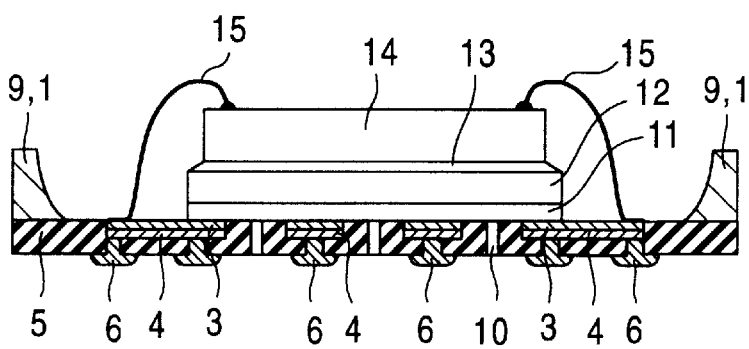

A semiconductor element 14 is die-bonded on the heat dissipating plate 12 with, for example, a silver-paste film 13, followed by wire bonding. FIG. 1G shows a state after the wire bonding. Each wire 15 composed of, for example, gold, connects an external electrode of the semiconductor element 14 and the wiring film 4 covered with the nickel underlayer 3 through the gold film 7 (not depicted in FIG. 1G). The nickel underlayer 3 and the gold film 7 on the wiring film 4 enhance wire bonding strength, since the surface gold film 7 has a high affinity for the gold wire 15 and the underlying nickel underlayer 3 blocks ultrasonic waves which are applied for bonding.

Figure 1H:
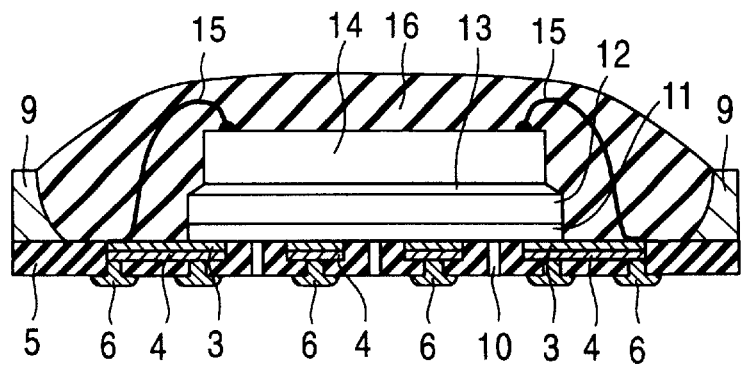

With reference to FIG. 1H, the semiconductor element 14 and its peripheral section are sealed with a sealing resin 16. The peripheral ring 9 functions as a dam blocking the flow of the resin towards the outside.

Figure 1I:
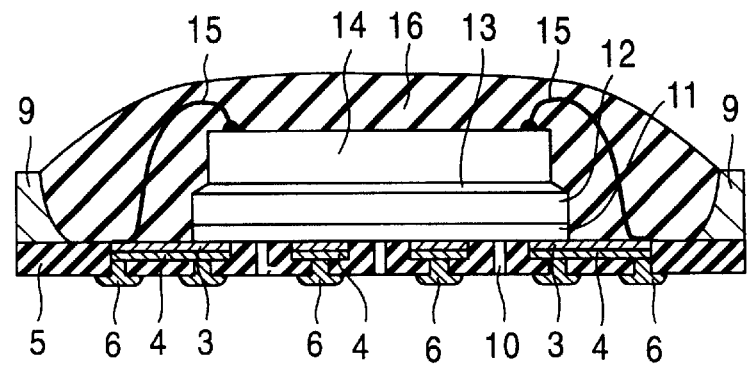
Figure 3A:
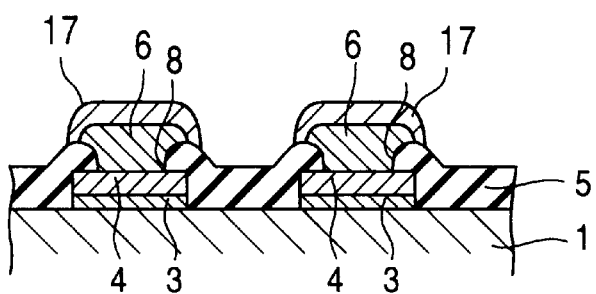
FIG. 3A is a cross-sectional view when a solder plating film is formed on nickel films as external electrodes.
Figure 3B:
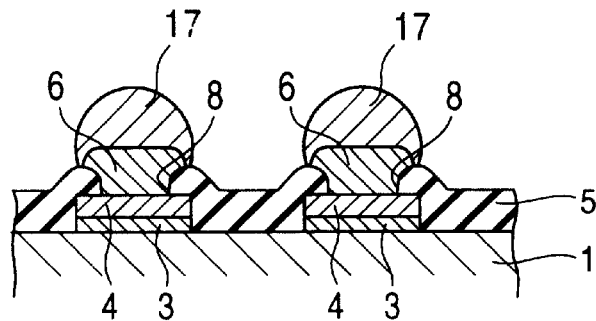
FIG. 3B is a cross-sectional view when the solder plating film is shaped by reflow.

With reference to FIG. 1I, the nickel external electrode 6 is shaped substantially spherically by, for example, reflow. Alternatively, a solder plating film 17 may be formed on the nickel film 6 as the external electrode 6 with a thickness of, for example, 50 to 100 μm as shown in FIG. 3A, and then may be shaped by reflow as shown in FIG. 3B. A semiconductor device is thereby produced.

In the semiconductor device shown in FIG. 1I, a plurality of wiring films 4 are formed on a surface section of a base 5 comprising an insulating resin, so that the surfaces of the wiring films 4 and the surface of the base 5 are positioned on the same plane and at least parts of the wiring films 4 overlap the electrode-forming holes 8 of the base 5. Each of the electrode-forming holes 8 is embedded with a nickel film 6 as a conductive material to form a protruding external electrode. A heat dissipating plate 12 is bonded to the surface of the base 5 with a cushion bond 11. The semiconductor element 14 is bonded to the heat dissipating plate 12 with a silver-paste film 13. Each electrode of the semiconductor element 14 is bonded to the corresponding wiring film 4 with a wire 15. Furthermore, the wiring film 4 and the wire 15 are sealed with a resin 15.

In this semiconductor device, the wiring film 4 is formed on a surface section of the base 5 so as to be embedded; hence the front surface of the base 5 is planarized. Since the semiconductor element 14 is mounted on the flat surface, bonding and wiring of the semiconductor device can be readily performed, resulting in enhanced reliability of the semiconductor device. Since the semiconductor element 14 is provided on the surface without a stepped structure, die bonding and wire bonding characteristics of the semiconductor element 14 are improved and wiring films with a fine pattern can readily formed. Since the electrode-forming holes 8 are formed by exposure and development of the base 5, fineness and high integration of the electrode-forming holes 8 can be achieved. Thus, high integration and multi-electrodes of the semiconductor device can also be achieved. Since the base 5 has vent holes 10, separation of the base 5 due to a popcorn phenomenon is prevented.

Since the peripheral metal ring 9 is provided at the exterior of the wire bonding sections of the wiring films 4 on the surface of the base 5, the peripheral ring 9 can be used as a ground electrode of an electrical power source, and as a electrostatic shield that electrostatically shields the semiconductor element 14 from the exterior. Also, it can be used as a dam that blocks the flow of the sealing resin to the exterior when resin sealing is performed, resulting in a decreased defect rate of the resin sealing.

In the method for making the semiconductor device shown in FIGS. 1A to 1I, wiring films 4 are formed by plating using a resist film as a mask which is selectively formed on a front surface of the metal substrate 1, wherein nickel films 3 for etching stop are formed as an underlayer. A base 5 composed of an insulating resin and having electrode-forming holes 8 and vent holes 10 is formed on the front surface of the metal substrate 1. The region of the metal substrate 1 in which at least the wiring films 4 are formed is etched from the back surface until the nickel film 3 for etching stop is exposed. Furthermore, a semiconductor element 14 is mounted onto the etched side and sealed with a resin.

According to such a method, the wiring films 4 are formed on the metal substrate 1 by plating using the resist film 2 as a mask, electrode-forming holes 8 are formed in a base 8, and then external electrodes 6 are formed by plating. Thus, the wiring films 4 and the external electrodes 6 are easily formed by electroplating, because the metal substrate 1 is electrically connected to all of the wiring films 4 so that a potential required for electroplating is applied to all of the wiring films 4 through the metal substrate 1. Since electroplating can form a plating film having higher quality than that of electroless plating, satisfactory wiring films 4 and external electrodes 6 are readily formed. Thus, fine, high-density arrangement of the wiring films 4 and the external electrodes 6 can be achieved. With fineness of the wiring films, the number of the wiring films that are provided between the external electrodes can be increased; hence the number of the external electrode arrays and the number of the external electrodes can be increased.

Figure 4A:
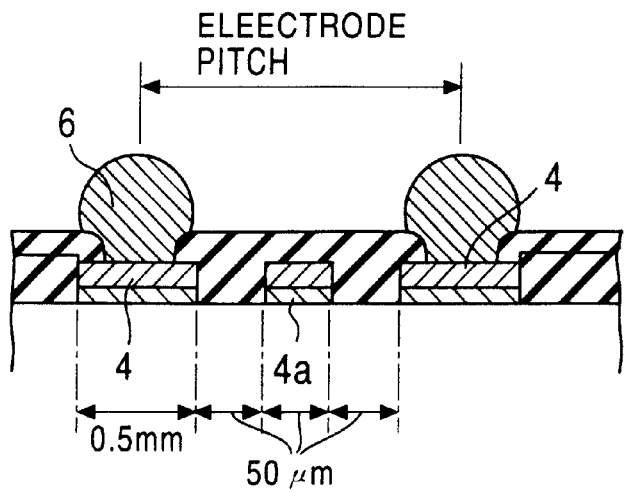
FIG. 4A is a cross-sectional view showing a conventional array pitch of the external electrodes.
Figure 4B:
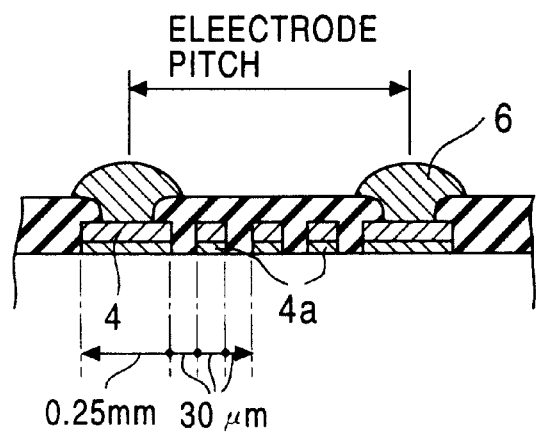
FIG. 4B is a cross-sectional view showing an array pitch in accordance with the present invention.
Figure 4C:
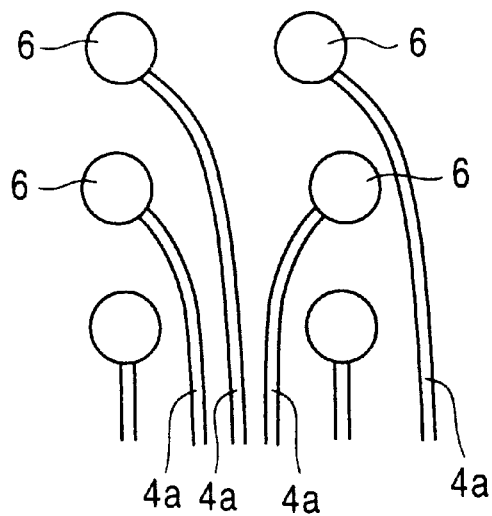
FIG. 4C is a plan view showing that the wiring films between the external electrodes are increased in this embodiment.

FIG. 4A is a cross-sectional view showing a conventional array pitch of the external electrodes. FIG. 4B is a cross-sectional view showing an array pitch in accordance with the present invention. FIG. 4C is a plan view showing that the wiring films between the external electrodes are increased in this embodiment. In a typical conventional FPC-type semiconductor device in which fine patterning is difficult, the width of the wiring film 4 is 500 μm for the portion for forming the external electrodes 6, or 50 μm between the external electrodes 6, and the distance between the wiring films 4 is 50 μm. Thus, when the pitch of the external electrode array is decreased, the number of wiring films 4 between the external electrodes 6 cannot be increased. In contrast, fine patterning can be performed in this embodiment; hence the number of the wiring films 4a between the external electrodes 6 can be increased as shown in FIG. 4C even when the pitch of the external electrode array is decreased, permitting a multiple spherical electrode array. This significantly contributes to multi-electrodes and high integration of semiconductor devices.

Since the electrode-forming holes 8 can be formed by patterning the base 5 on the metal substrate 1, fineness of the electrode-forming holes 8 is achieved. The size of the electrode-forming holes 8 can be reduced to 0.22 mm or less in a rigid substrate type, whereas its lower limit is 0.5 mm for a conventional FPC type or 0.35 mm for a conventional rigid substrate type. Fineness of the electrode-forming holes 8 results in a higher array density of the electrode-forming holes 8. The electrode-forming holes 8 are formed by patterning the insulating resin, hence working is not troublesome and productivity is high compared with a method requiring drilling of the holes.

The region for forming the wiring films 4 of the metal substrate 1 is etched from the back surface until the nickel metal underlayer 3 for etching stop is exposed, so that the metal substrate 1 remains as a ring 9 at its exterior. The ring 9 can be used as a terminal of the ground electrical power source, and for electrostatic shielding, as described above. The ring 9 is formed in the peripheral region by etching, with high working accuracy. Thus, the semiconductor device has a peripheral form which is highly accurate.

In the production process of the semiconductor device, the metal substrate 1 is used as a base material, thus, deformation such as distortion does not occur in the production process. Thus, handling and working are facilitated. The peripheral ring 9 may be removed to miniaturize the semiconductor device in some cases. Since the resin 16 has reinforcement effects after resin sealing, the peripheral ring 9 also having reinforcement effects is not always essential and may be omitted in some cases. In such a case, the peripheral ring 9 may be removed to miniaturize the semiconductor device.

FIGS. 5A to 5K are cross-sectional views of the steps of a method for making a BGA-type semiconductor device in accordance with the present invention, as a second embodiment.

Figure 5A:
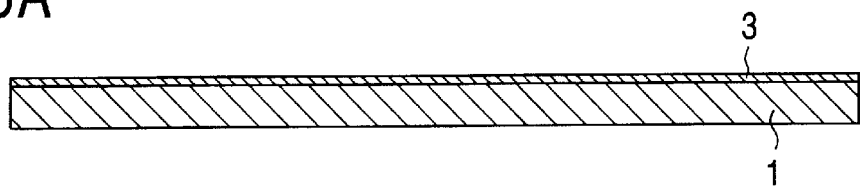

With reference to FIG. 5A, a laminate film of a thin copper or copper alloy film 1 with a thickness of, for example, 150 μm and a nickel film 3 provided thereon for etching stop with a thickness of, for example, 2 μm is prepared as a metal substrate.

Figure 5B:
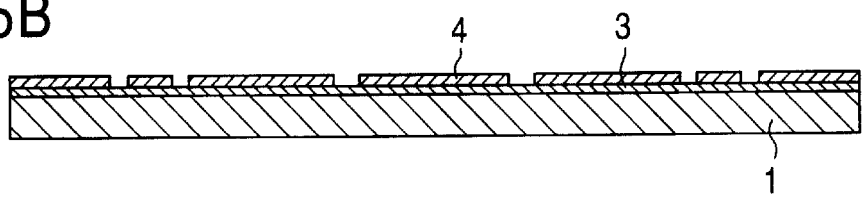

With reference to FIG. 5B, copper wiring films 4 with a thickness of, for example, 25 m are selectively formed as follows. Resist films are selectively formed on the surface of the nickel film 3 to form a mask, and copper films 4 are plated on the nickel film 3 using the mask. The process is substantially the same as that in the first embodiment. Thus, the wiring films 4 are selectively formed by the same method as in the first embodiment. In the first embodiment, however, the metal substrate is composed of copper or a copper alloy not having a surface nickel film, hence a nickel film 3 for etching stop is formed by plating using a resist film as a mask, and then the copper wiring films 4 are formed by plating. In the second embodiment, the nickel film 3 has already been formed on the metal substrate, and the formation of the nickel film 3 by plating is not necessary.

Figure 5C:
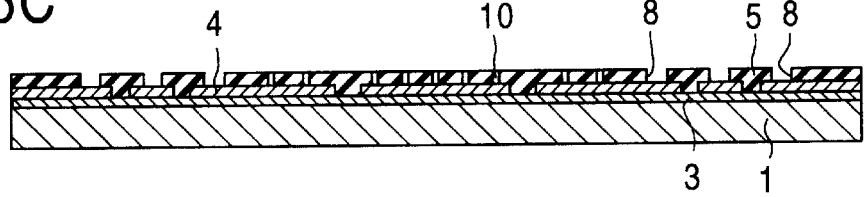

With reference to FIG. 5C, bases 5 composed of polyimide are selectively formed as in the first embodiment to form electrode-forming holes 8 and vent holes 10 which are considerably smaller than the electrode-forming holes 8.

Figure 5D:
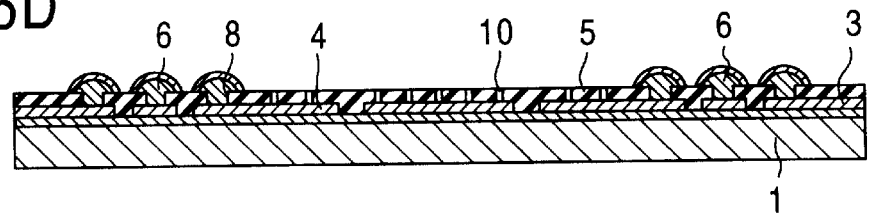

With reference to FIG. 5D, nickel films 6 are deposited in the electrode-forming holes 8 by plating so as to protrude from the electrode-forming holes 8. Solder films 27 with a thickness of, for example, approximately 100 μm are formed on the nickel films 6 with a thickness of 40 to 150 μm.

Figure 5E:
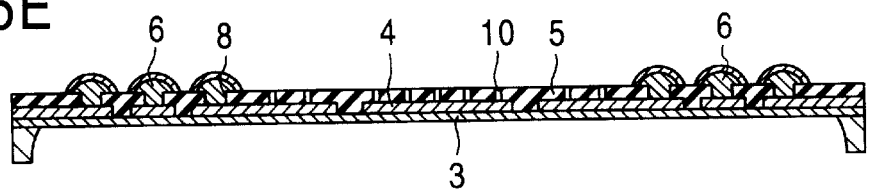

With reference to FIG. 5E, the copper portion on the metal substrate 1 is selectively etched so that the surface of the nickel film 3 is exposed and the metal substrate 1 is left as a peripheral ring 9 at the peripheral section. In the etching, the nickel film 3 blocks etching of the copper wiring films 4, that is, functions as a metal film for stopping etching.

Figure 5F:
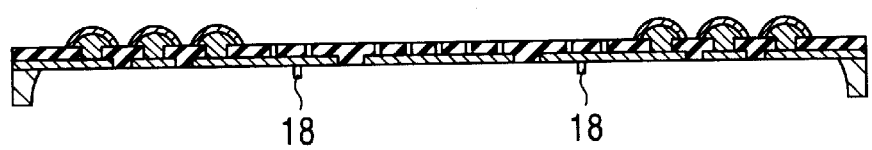

With reference to FIG. 5F, the nickel film 3 for etching stop is removed by etching, because the nickel film 3 formed on the entire surface of the substrate 1 will cause short-circuiting if it is allowed to remain. In contrast, in the first embodiment, the nickel films 3 and the wiring films 4 are formed by the same pattern, hence etching between the wiring films is not necessary, and this step is not provided.

A dam 18 is formed on the surface after removing the nickel film 3 by, for example, a screen printing process, so that it blocks the flow of the resin during the resin sealing process. The dam 18 is formed as a ring at the peripheral section of the resin-sealing region of the semiconductor device that will be bonded later.

Figure 5G:
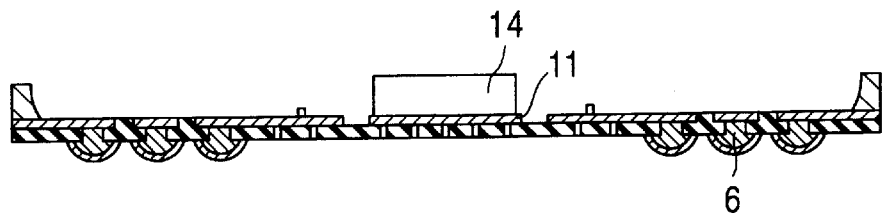
Figure 5G:
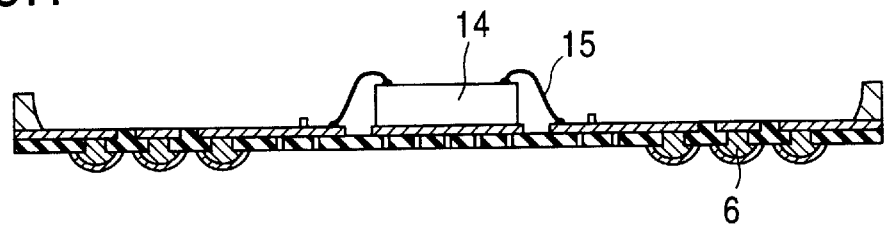
Figure 5I:
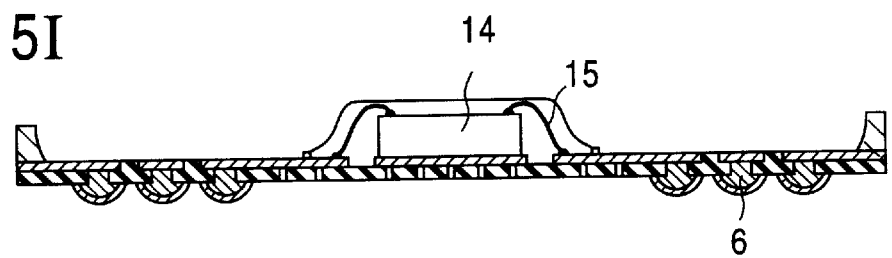
Figure 5J:
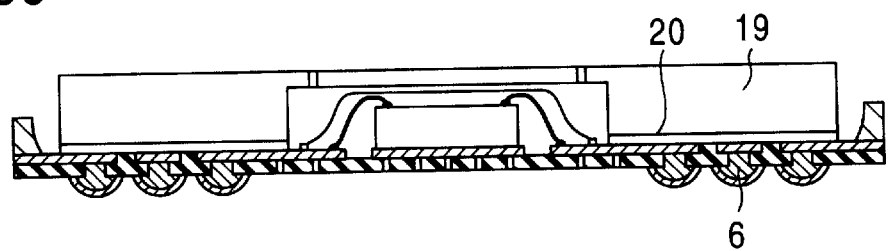

With reference to FIG. 5G, a semiconductor element 14 is bonded with a cushion bond 11. Next, with reference to FIG. 5H, wire bonding is performed using wires 15. With reference to FIG. 5I, the semiconductor element 14 is sealed with a resin 16. With reference to FIG. 5J, a reinforcing member 19 is bonded with a bonding agent 20.

Figure 5K:
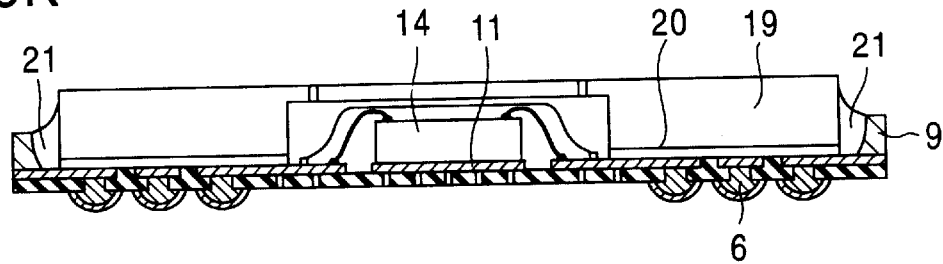

With reference to FIG. 5K, the reinforcing member 19 is bonded to the peripheral ring 9 with, for example, a silver paste 21. The silver paste 21 is applied and is subjected to reflow between the reinforcing member 19 and the peripheral ring 9. A semiconductor device in the second embodiment of the present invention is thereby formed.

The semiconductor device and the method for making the semiconductor device in accordance with the second embodiment also have similar advantages to those of the first embodiment. In the second embodiment, a possible modification is a metal substrate 1 not having a surface nickel film 3 as in the first embodiment. The peripheral ring 9 may be removed later to achieve miniaturization of the semiconductor device, because the reinforcing member 19 sufficiently develops the reinforcing and electrostatic functions in place of the peripheral ring 9.

Figure 6:
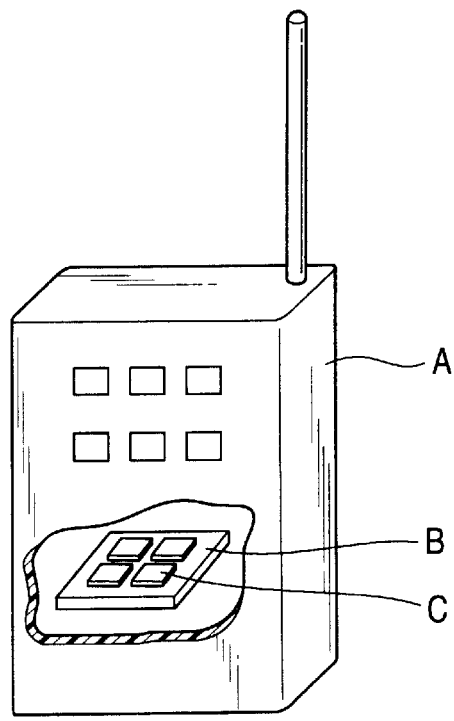
FIG. 6 is a partly broken isometric view of an electronic device using a semiconductor device of the present invention.
Figure 7A:
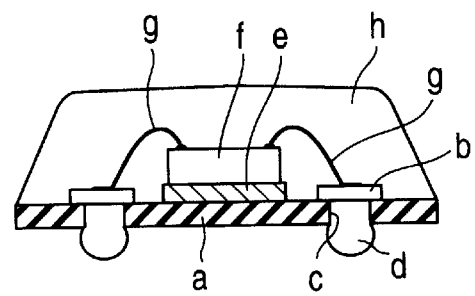
FIGS. 7A and 7B are cross-sectional views of a flexible printed circuit (FPC) type wire-bonding CSP and a rigid substrate type wire-bonding CSP.
Figure 7B:
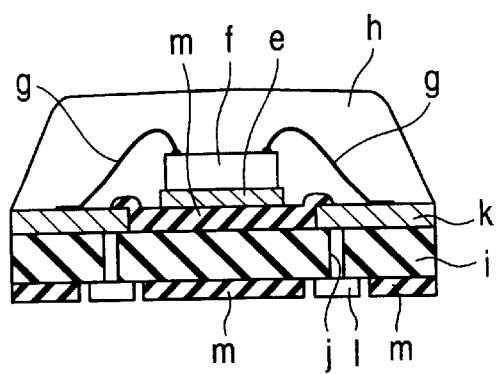

The semiconductor device can be used in various electronic devices, and particularly meets the high demands of miniaturization in, for example, portable phones. FIG. 6 shows an electronic device A or a portable phone, in which a semiconductor device C in accordance with the present invention is mounted as an internal circuit of the electronic device onto a mother board B.

What is claimed is:

1. A method for making a film circuit comprising:

a step of forming wiring films on a metal film for stopping etching as an underlying layer by plating using a mask film, the mask being selectively formed on a front surface of a metal substrate;

a step of forming a base comprising an insulating resin and having electrode-forming holes on the front surface of the metal substrate such that at least parts of the wiring films are partly exposed; and a step of etching at least the region of the metal substrate, in which the wiring films are formed, from the back surface until the metal film for stopping etching is exposed.

2. A method for making a film circuit according to claim 1, wherein said metal film for stopping etching is formed by using the mask after said mask is formed and before the wiring films are formed.

3. A method for making a film circuit according to claim 1, wherein the metal film for stopping etching is deposited on the surface of the metal substrate;

a mask film is selectively formed on the metal film for stopping etching, and the wiring films are formed on the metal film as an underlying layer through the mask film by plating; and after completing the etching step for exposing the metal film for stopping etching from the back surface at least in the region of the metal substrate in which the wiring films are formed, the metal film for stopping etching is removed.

4. A method for making a semiconductor device using a film circuit according to claim 1, comprising a step of forming external electrodes in the electrode-forming holes and a step of electrically connecting the wiring films and the electrodes of the semiconductor device.

5. A method for making a semiconductor device using a film circuit according to claim 2, comprising a step of forming external electrodes in the electrode-forming holes and a step of electrically connecting the wiring films and the electrodes of the semiconductor device.

* * * * *